United States Patent
Chambers et al.

(10) Patent No.: US 7,135,775 B2
(45) Date of Patent: Nov. 14, 2006

(54) ENHANCEMENT OF AN INTERCONNECT

(75) Inventors: Stephen T. Chambers, Portland, OR (US); Valery M. Dubin, Portland, OR (US); Andrew W. Ott, Hillsboro, OR (US); Christine S. Hau-Riege, Milpitas, CA (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 10/292,326

(22) Filed: Nov. 12, 2002

(65) Prior Publication Data

US 2003/0137050 A1   Jul. 24, 2003

Related U.S. Application Data

(62) Division of application No. 10/051,971, filed on Jan. 18, 2002, now Pat. No. 6,518,184.

(51) Int. Cl.
*H01L 23/48* (2006.01)
*H01L 23/52* (2006.01)

(52) U.S. Cl. .................. 257/762; 257/751; 257/761; 257/763

(58) Field of Classification Search ........... 257/751, 257/752, 753, 758, 759, 760, 761–763, 764; 438/687, 627, 634, 643, 653, 682
See application file for complete search history.

(56) References Cited

U.S. PATENT DOCUMENTS

| | | | |
|---|---|---|---|
| 4,749,548 A | * | 6/1988 | Akutsu et al. .............. 420/469 |
| 5,447,887 A | | 9/1995 | Filipiak et al. |
| 6,046,108 A | | 4/2000 | Liu et al. |
| 6,110,817 A | * | 8/2000 | Tsai et al. .................. 438/618 |
| 6,211,084 B1 | | 4/2001 | Ngo et al. |
| 6,261,951 B1 | * | 7/2001 | Buchwalter et al. ........ 438/644 |
| 6,297,155 B1 | | 10/2001 | Simpson et al. |
| 6,303,505 B1 | | 10/2001 | Ngo et al. |
| 6,323,131 B1 | | 11/2001 | Obeng et al. |
| 6,333,248 B1 | | 12/2001 | Kishimoto |
| 6,368,954 B1 | | 4/2002 | Lopatin et al. |
| 6,407,453 B1 | * | 6/2002 | Watanabe et al. ........... 257/758 |
| 6,426,294 B1 | * | 7/2002 | Hirabayashi et al. ....... 438/690 |
| 6,479,380 B1 | * | 11/2002 | Furusawa et al. .......... 438/638 |
| 2002/0119651 A1 | | 8/2002 | Noguchi et al. |

FOREIGN PATENT DOCUMENTS

EP   0 881 673 A2   12/1998
EP   1 050 902 A2   11/2000

OTHER PUBLICATIONS

Search Report for PCT/US 03/00525 mailed Aug. 12, 2003, 6 pages.

* cited by examiner

*Primary Examiner*—Hung Vu
(74) *Attorney, Agent, or Firm*—Blakely, Sokoloff, Taylor & Zafman LLP

(57) ABSTRACT

A method, apparatus, system, and machine-readable medium for an interconnect structure in a semiconductor device and its method of formation is disclosed. Embodiments comprise a carbon-doped and silicon-doped interconnect having a concentration of silicon to avoid to forming a copper silicide layer between an interconnect and a passivation layer. Some embodiments provide unexpected results in electromigration reliability in regards to activation energy and/or mean time to failure.

8 Claims, 7 Drawing Sheets

CROSS-SECTIONAL VIEW OF A PORTION OF AN INTERGRATED CIRCUIT

METALLIZATION LAYER 1
VIA 170
METALLIZATION LAYER 2
METALLIZATION LAYER 1
100 INTRA-LEVEL DIELECTRIC LAYER
110 BARRIER LAYER
120 $Cu_xC_yS_{iz}$ INTERCONNECT
130 PASSIVATION LAYER OR INTER-LEVEL DIELECTRIC LAYER (IDL)
140 CIRCUIT LAYER
150 CONTACT
160 CONTACT

CROSS-SECTIONAL VIEW OF A PORTION OF AN INTERGRATED CIRCUIT

PATERN E.G. DAMASCENE TRENCHES

210 — INTERCONNECT FEATURE

200 — SiO2

DEPOSIT BARRIER (E.G. TaN) AND SEED (E.G. CU) INTO INTERCONNECT FEATURE FOLLOWED BY ELECTROPLATED CARBON DOPED COPPER (E.G. $Cu_xC_y$)

300 — TaN    310 — $Cu_xC_y$    200 — SiO2

EXCESS CARBON DOPED COPPER (E.G. $CU_XC_Y$) IS POLISHED OFF THE WAFER SURFACE $CU_XC_Y$ SURFACE IS CLEANED WITH A PLASMA (E.G. $NH_3$) THEN EXPOSED TO SILANE BEFORE DEPOSITING SILICON NITRIDE

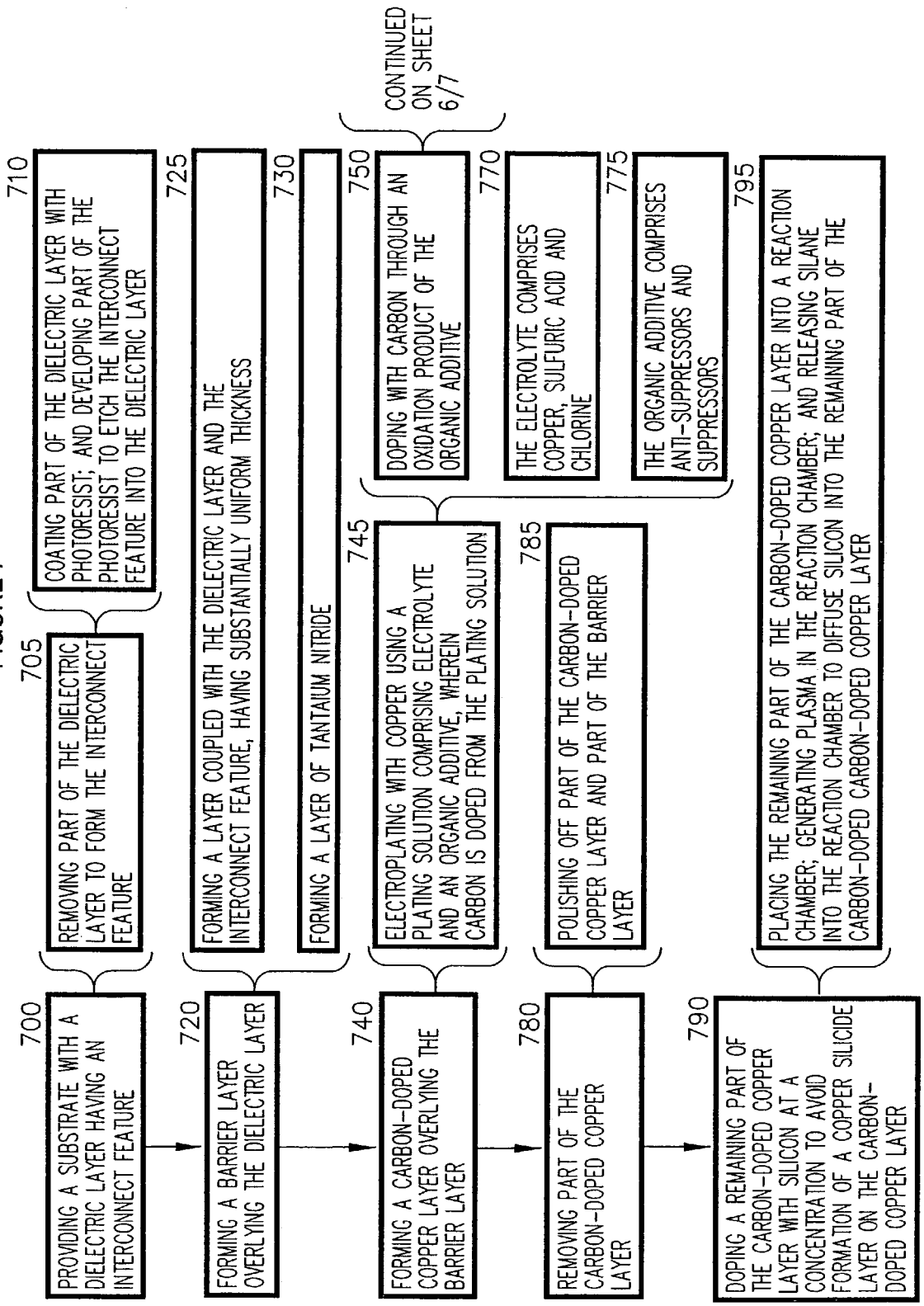

ENHANCEMENT OF AN INTERCONNECT

CROSS REFERENCE TO RELATED APPLICATIONS

This is a divisional application of application Ser. No. 10/051,971, filed Jan. 18, 2002 now U.S. Pat. No. 6,518,184, and claims the priority of that filing date.

FIELD OF INVENTION

The present invention is in the field of semiconductor devices. More particularly, the present invention provides a method, apparatus, system, and machine-readable medium for an interconnect structure in a semiconductor device and its method for formation.

BACKGROUND

Integrated circuits continue to be scaled down to smaller dimensions. Interconnects, in particular, are reducing in pitch and volume to accommodate the smaller dimensions. Down sizing the interconnects increases current density in, and resistance of, the interconnects. The increases in current density in process generations since the 0.25 micron process technology exhibit significant reliability issues with respect to interconnects as a result of electromigration and, as a result, current conservative design rules and practices are too conservative, or not sufficiently accurate to keep up with design demands.

Electromigration is a process wherein hydrostatic stress on interconnects, such as a direct current applied to an interconnect in one direction, causes current-induced atomic diffusion due to momentum transfer from flowing electrons to host atoms, or a diffusion of electrons in electric fields set up in the interconnect while the circuit is in operation. The metal at anode-end of the interconnect thins or pulls back from the adjacent via and eventually separates completely, causing an opening or void in the circuit. The metal at the cathode-end of the interconnect forms extrusions and crack insulators which leads to device degradation such as short-circuiting interconnects and diffusing metal into the substrate or, more particularly, into the circuit layer and/or a dielectric layer of the substrate. Electromigration reliability is measured in terms of mean time to failure and activation energy. Mean time to failure (MTF) is typically defined as the number of hours before an interconnect increases in electrical resistance by 30% for certain length and width interconnects at a temperature, such as 250 degrees Celsius with the application of a constant current density such as $1\times10^6$ amperes per square centimeter.

Activation energy is the energy level at which electromigration begins to occur. Activation energy of pure copper, for instance, is lower than aluminum alloys when used in interconnects but both copper and aluminum are used to form interconnects since copper offers intrinsic advantages over aluminum, including a lower resistivity. Lower resistivity allows higher current densities so a smaller copper interconnect may potentially handle the same current as an aluminum interconnect with the same electromigration reliability. In addition, copper based interconnects, unlike aluminum-based interconnects, are surrounded on at least three sides by refractory metal layers that serve as diffusion barriers. After electromigration leads to voiding in the copper interconnects, current shunts around the voids through the refractory metal layers so that even voids that span the length, width, and thickness of interconnects do not cause open-circuit failure. Copper, however, does not solve the increasing problem of electromigration. The voiding leads to an increase in resistance, and as the resistance increases, the void grows. As a result, problems associated with electromigration increase as the interconnects become smaller and metallization layers become more densely populated with interconnects.

BRIEF FIGURE DESCRIPTIONS

In the accompanying drawings, like references may indicate similar elements:

Skilled artisans appreciate that elements in the figures are illustrated for simplicity and clarity and have not necessarily been drawn to scale. For example, the dimensions of some of the elements in the figures are exaggerated relative to other elements to help to improve understanding of embodiment(s) of the present invention

DETAILED DESCRIPTION OF EMBODIMENTS

The following is a detailed description of example embodiments of the invention depicted in the accompanying drawings. The example embodiments are in such detail as to clearly communicate the invention. However, the amount of detail offered is not intended to limit the anticipated variations of embodiments. The variations of embodiments anticipated for the present invention are too numerous to discuss individually so the detailed descriptions below are designed to make such embodiments obvious to a person of ordinary skill in the art.

Figure 1:
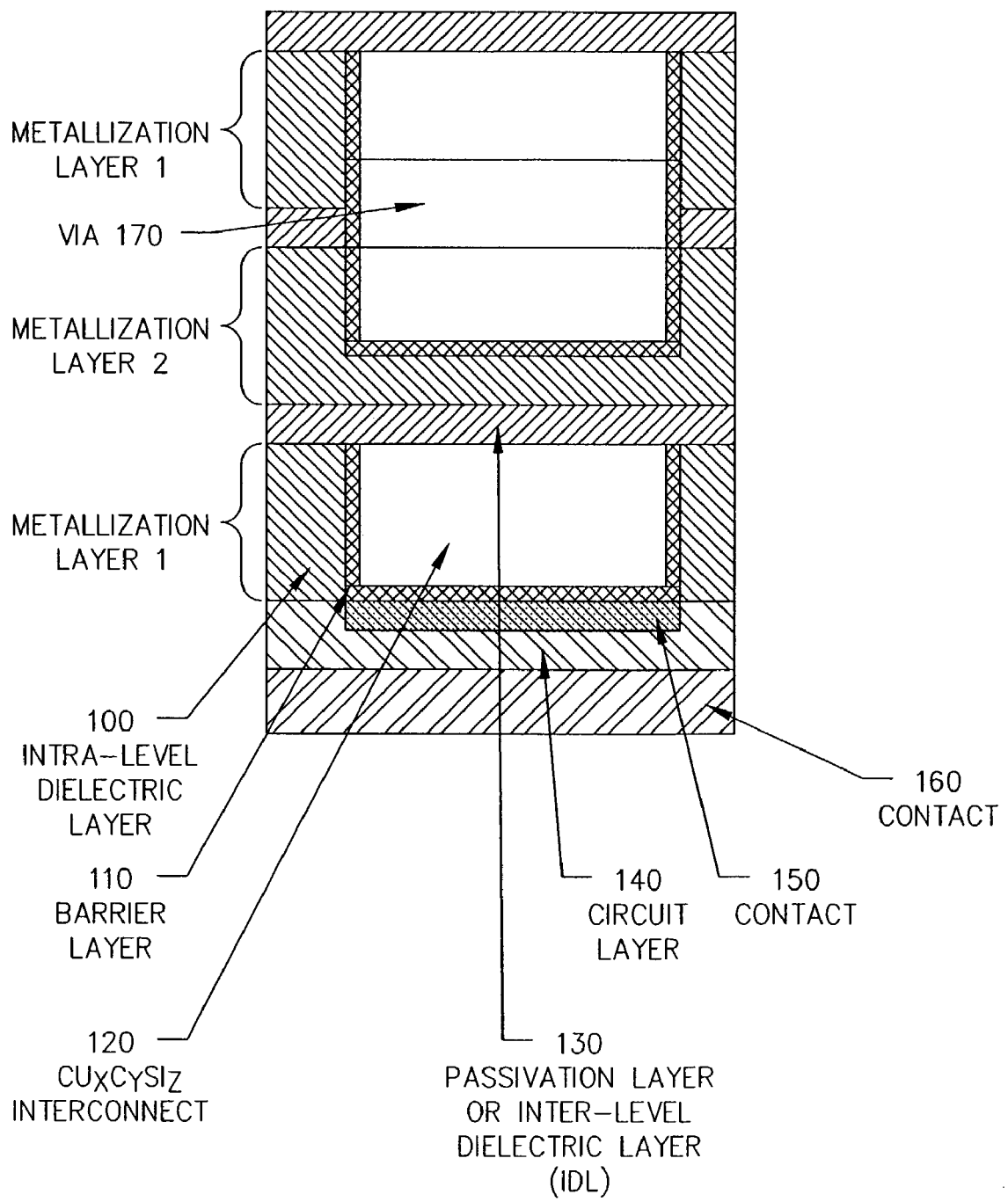
FIG. 1 depicts an embodiment of a cross-sectional view of a portion of an integrated circuit to enhance an interconnect.

Referring now to FIG. 1, there is shown an embodiment of a cross-sectional view of a portion of an integrated circuit with an enhanced interconnect. Many embodiments such as the embodiment shown in FIG. 1, have an interconnect or have a method for building an interconnect with enhanced electromigration reliability in regards to activation energy and/or MTF. A semiconductor device, such as the embodiment shown, may be manufactured sequentially, one layer at a time. The sequence may comprise forming or growing a silicon crystal, slicing the silicon into wafers, polishing the wafer, forming devices on the substrate 160 of the wafer in a circuit layer 140 by alternatively depositing a thin layer of dielectric, such as an oxide of silicon, etching the dielectric with a process like photolithography, and forming a contact 150 in the circuit layer 140 to allow the circuitry of the circuit layer 140 to be accessed by signaling media, interconnects such as the carbon-doped and silicon-doped interconnect, $Cu_XC_YSi_Z$ interconnect 120. The specific concentration or molecular ratio X, Y, and Z may vary between embodiments. In some embodiments, the concentration or doping of carbon in $Cu_XC_YSi_Z$ interconnect 120 may be within a range of 1 to 100 parts per million, whereas, other embodiments may comprise carbon concentrations within a range of 1 to 1000 parts per million. Further, the concentration or doping of silicon in $Cu_XC_YSi_Z$ interconnect 120 may be within a range of 300 to 900 parts per million, but in other embodiments, silicon concentrations may range from zero percent to eight percent silicon. In some embodiments, barrier layer 110 may be formed in an interconnect feature, or an opening etched or otherwise formed for an interconnect, before forming the interconnect to prevent or attenuate diffusion of atoms of the interconnect into the intra-level dielectric 100 and/or circuit layer 140. After forming the interconnect, a layer of inter-level dielectric, such as passivation layer 130, may be formed overlying the interconnect and/or the remainder of metallization layer 1 to protect the interconnect from contamination like moisture and/or to provide insulation between layers of interconnects.

One or more metallization layers, such as metallization layer 1, metallization layer 2, and metallization layer 3, may be formed by forming interconnect features in intra-level dielectric, and then forming a thin conductive layer, such as barrier layer 110 and/or a conductive layer, like tungsten, copper, or aluminum on the intra-level dielectric, to form contacts or vias and/or interconnects. Via 170, for example, may couple the interconnect of metallization layer 3 with the interconnect of metallization layer 2. In some embodiments, via 170 may comprise a metal such as tungsten but in other embodiments, via 170 may comprise the same material as is used for an interconnect such as $Cu_XC_YSi_Z$. Patterning intra-level dielectric layer 100 may comprise photolithography and plasma etching. The excess metal, or metal protruding above the opening of intra-level dielectric layer 100, may be removed from the surface by planarizing the surface. Planarization, patterning, and/or polishing of metallization layer 1 before forming the passivation layer or inter-level dielectric layer (IDL) 130 may form or define conductive interconnects and reduce topographical effects of photolithography and etching.

Further, packaging may encompass the integrated circuit comprising the substrate up through the metallization layers to protect the integrated circuit and to provide interconnections for use in a product. The packaging may comprise ceramics and/or polymers to protect the integrated circuit from physical damage and leads to provide a signaling medium from the circuit layer to an external device, through one or more interconnects.

Figure 2:
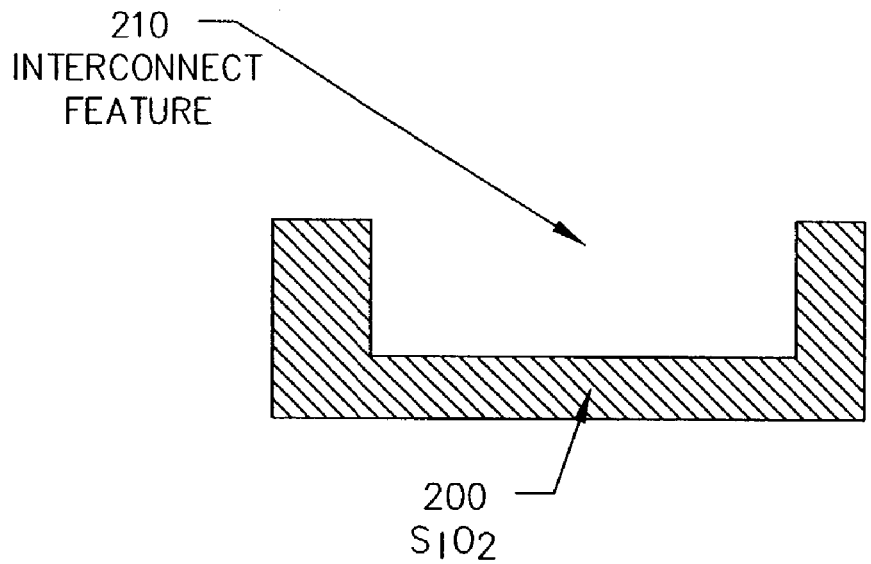
FIG. 2 depicts an embodiment of a cross-sectional view of a portion of a semiconductor device that has been partially processed to define an interconnect feature.

Referring now to FIG. 2, there is shown an embodiment of a cross-sectional view of a portion of a semiconductor device that has been partially processed to define an interconnect feature 210, such as a damascene trench. In a semiconductor manufacturing method known as "damascene", a dielectric layer, such as a layer of silicon dioxide ($SiO_2$) 200, may be deposited on a substrate, and interconnect features may be formed in $SiO_2$ 200 to create a trench pattern in the shape of interconnects such as vias or metal lines.

$SiO_2$ 200 may comprise a dielectric layer overlying silicon wafer. In some embodiments, a silicon nitride film, or other layer like an etch stop or passivation layer, may be formed on the substrate of the wafer before $SiO_2$ 200 is formed on the substrate. $SiO_2$ 200 may comprise a layer of approximately 5000 angstroms to 3 microns in thickness. In one embodiment, a dielectric layer, such as $SiO_2$ 200, may be formed as a layer of plasma deposited oxide formed using tetra-ethyl-ortho-silicate (TEOS) as a source gas. In some embodiments, $SiO_2$ 200 may be deposited using $SiH_4$ and an oxidizer such as oxygen ($O_2$) or nitrous oxide ($N_2O$). In another embodiment, the intra-level dielectric may be formed as a layer of a phospho-silicate-glass (PSG), boron doped PSG (BPSG), silicon oxide glass (SOG), silicon dioxide, fluorine-doped silicon oxide, low dielectric constant (low-k) insulator, spin-on dielectric material, or the like. A low-k insulator may be a material having a dielectric constant lower than $SiO_2$. In some embodiments, an etch stop layer may be formed such as plasma deposited silicon oxynitride. In alternative embodiments, an etch stop layer may be plasma deposited silicon nitride, silicon carbide, boron nitride, or other similar material. The etch stop layer may facilitate etching through more than one layer of dielectric to form a via or other opening below the interconnect feature, such as a dual damascene trench.

Figure 3:
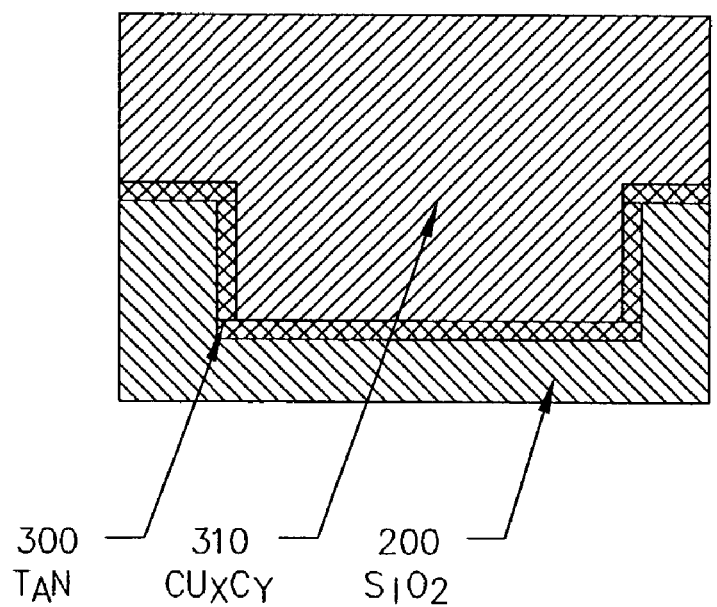
FIG. 3 depicts an embodiment of a cross-sectional view of the substrate of FIG. 2 after the formation of a barrier layer and carbon-doped copper layer.

Referring now to FIG. 3, there is shown an embodiment of a cross-sectional view of the substrate of FIG. 2 after the formation of a barrier layer and carbon-doped copper ($Cu_XC_Y$) layer. Metal may be deposited into the interconnect feature or trench patterned in the $SiO_2$ layer 200. In the present embodiment, a barrier layer of metal, tantalum nitride (TaN), may be deposited in the interconnect feature first, followed by a seed layer of copper (Cu). Then, carbon-doped copper ($Cu_XC_Y$) may be formed into the interconnect feature by electroplating. In other embodiments, $Cu_XC_Y$ may be formed in the interconnect feature by electroless, sputtering, vapor phase epitaxy, ion implantation, and/or other similar means or process.

Barrier layers may be employed in metallization schemes that use damascene patterning of copper to prevent diffusion of copper into Si or $SiO_2$ regions of the substrate or wafer. Diffusion of copper through insulators may cause shorts or decrease electron lifetime in transistors or other devices in a circuit layer. The substrate, for instance, may comprise a circuit layer with devices such as capacitors and transistors. In devices, such as capacitors, the barrier layer may prevent inter-diffusion between a plug or contact and a bottom electrode layer. The plug may be formed of tungsten (W) or polysilicon (p-Si), and the bottom electrode layer may be formed of transition metals, such as Iridium (Ir), Platinum (Pt), Palladium (Pd), Rhodium (Rh), (Os) Osmium, etc., or conductive oxides of Ir, Pt, Pd, Rh, Os and/or a combination of a transition metal and conductive oxide. Some embodiments further comprise a doped barrier layer.

In some embodiments, wherein the barrier layer, TaN 300, may be formed by sputtering, TaN 300 may possess higher atomic weight elements to increase sidewall coverage. The increase in sidewall coverage may result in an increase in the activation energy and/or attenuation of electromigration failure. In further embodiments, the resistivity of the barrier layer may be selectively varied with metal carbides such as TaC or HfC.

The barrier layer, such as TaN 300, may be formed within an interconnect feature such as interconnect feature 210 of FIG. 2. In alternative embodiments, the barrier layer may comprise a layer of titanium nitride, titanium silicon nitride, tungsten nitride, tantalum silicon nitride, tantalum, titanium tungsten, or the like. The TaN 300 may be deposited using methods such as collimated sputtering, ionized sputtering, or chemical vapor deposition (CVD). The upper limit of the barrier thickness may depend on the deposition technique and the geometry of the features being built. For instance, when tapering the sides of a damascene trench and via, a much thicker barrier layer may be deposited. In some embodiments, TaN 300 may be deposited with a thickness in the range of approximately 10–50 angstroms by atomic layer deposition (ALD). In other embodiments, the barrier layer may be formed at a thickness in a range from approximately 150 to 300 angstroms. In still further embodiments, a TiN barrier (TiSiN) may be deposited in the range of 50–150 angstroms by CVD.

In some embodiments, a seed layer and a conductive layer may be formed overlying the barrier layer, TaN 300. The seed layer may comprise substantially one element, such as copper, nickel, tin, or the like. In the present embodiment, the seed layer comprises copper. In many embodiments, the seed layer may comprise copper and magnesium or other alloying materials or combinations of alloying materials including indium, tin, chromium, zinc, carbon, zirconium, palladium, titanium, iron, niobium, magnesium, or the like.

The seed layer may be formed using a physical vapor deposition (PVD) process such as plasma enhanced physical vapor deposition (PEVD) with a sputtering target comprising copper. The seed layer may alternatively be deposited with other PVD deposition processes such as ionized PVD, long throw PVD, collimated PVD, a chemical vapor deposition (CVD) process, or a plating process, such as electroless plating or electroplating. The seed layer may be deposited as a continuous layer overlying TaN 300 and formed within an interconnect feature. In one embodiment, the seed layer may be deposited at a thickness in a range of approximately 150–250 nanometers. However, the seed layer may be formed sufficiently thick to thoroughly plate the barrier layer, or $SiO_2$ layer 200, and thin enough, to prevent excessive lateral build-up of the seed layer over corner edges of the interconnect feature 210 of FIG. 2. For example, the seed layer may be formed at a thickness of approximately 2000 angstroms.

A conductive layer may be $Cu_XC_Y$ layer 310 and may be formed overlying the seed layer. The conductive layer may have a thickness that is sufficient to fill the remainder of the interconnect feature 210, such as approximately 600 nanometers, which may be approximately 1.5 times the depth of the interconnect feature 210. In one embodiment, $Cu_XC_Y$ layer 310 may be deposited using conventional electroplating techniques with a plating solution comprising an electrolyte, such as copper, sulfuric acid, and chlorine, and organic additives such as anti-suppressors and suppressors. Additives may be introduced into the bath to induce microstructures such as a large grain size and/or randomly oriented grains. For example, the anti-suppressors may comprise bath soluble disulfide or mono-sulfide and the suppressors may comprise bath soluble polyethers, polyamines, polyimines, and polyamids. As a result, the conductive layer, such as copper, may be doped with carbon from the plating solution during the electroplating process.

In some embodiments, the conductive layer may also be doped with carbon through an enhanced production of oxidation products from the anti-suppressors and suppressors. The amount of oxidation product in the plating bath may be characterized by the total oxidizable carbon (TOC). In many embodiments, the TOC should not exceed about 500 ppm since a high concentration of oxidation products from the organic additives may produce conformal deposition instead of bottom up (or super-fill) deposition in trenches, or vias. Super-fill deposition, for example, may fill high aspect ratio features.

The oxidation products of the plating solution may be enhanced by reverse plating. Reverse plating may increase oxidation of organic additives by alternating current between a cathode and, an anode. In several embodiments, reverse plating may be accomplished with a one millisecond to ten second pulse frequency comprising a forward current of 0.1 to 60 milliamperes per square centimeter and a reverse current of one to 100 milliamperes per square centimeter. In further embodiments, reverse plating may be accomplished with a multi-step direct current comprising an initiation current of 0.1 to one milliampere per centimeter squared, one or more applications of a fill current of one to 30 milliamperes per square centimeter, and a bulk fill current of 30 to 60 milliamperes per square centimeter. The number of applications of the fill current may depend, in part, upon the speed of the reaction causing the metal to plate the seed layer or barrier layer of the interconnect feature.

In many embodiments, a copper electrode, such as an anode and/or a cathode, may be used as a catalyst for oxidation of the organic additives. A pure copper anode, for instance, may increase oxidation products of the organic additives. In other embodiments, an anode doped with phosphorous may decrease the oxidation rate of organic additives by forming a protective film on the anode, sometimes be referred to as a "black" anode film. In further embodiments, other deposition processes including electroless plating, ALD, CVD, PVD, or a combination of CVD plus PVD may form the conductive layer.

Referring still to FIG. 3, after depositing the conductive layer, $Cu_XC_Y$, on the seed layer, the wafer may be annealed. Annealing may diffuse constituents such as carbon from the conductive layer into the seed layer. The diffusion of constituents may result in a redistribution of the constituents throughout the seed layer and the conductive layer, to create $Cu_XC_Y$ layer 310. The redistribution of the constituents may be homogenous throughout the seed layer and the conductive layer, higher in the seed layer, or agglomerated at the surfaces and interfaces of the seed layer and the conductive layer depending on the constituents and the annealing conditions. In many embodiments, the wafer may be annealed at temperatures ranging from 300–450 degrees Celcius for 20 to 30 minutes.

Further, annealing a conductive layer may improve the electromigration reliability of the interconnect. In embodiments where the conductive interconnect may be formed using a barrier layer and a conductive layer, the substrate may be annealed at approximately 200 degrees Celcius for approximately five minutes. The substrate may alternatively be annealed in a range of 250–400 degrees Celcius for one minute or more as a means of improving throughput. Annealing the conductive layer in nitrogen or a vacuum may attenuate the oxidation of exposed surface(s). In several embodiments, after annealing the wafer, the conductive layer, $Cu_XC_Y$ layer 310 may comprise an electroless plated copper seed layer with a layer such as an electroplated $Cu_XC_Y$ layer.

Figure 4:
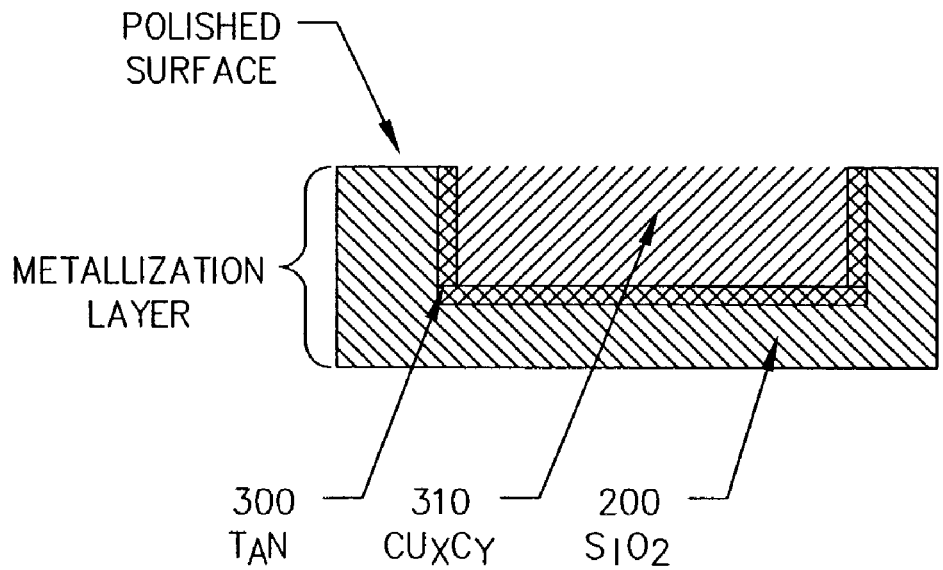
FIG. 4 depicts an embodiment of a cross-sectional view of the substrate of FIG. 3 after forming a carbon-doped copper interconnect.

Referring now to FIG. 4, the metallization layer, a combination of the $Cu_XC_Y$ 310, TaN 300, and $SiO_2$ 200, may be planarized to remove excess $Cu_XC_Y$. In many locations on the wafer, the metallization layer may be planarized to or into the $SiO_2$ 200, removing $Cu_XC_Y$ 310 from the top surface of the $SiO_2$ 200. The result of this process or a series of similar processes may be a series of metal lines substantially surrounded by $SiO_2$ 200.

Figure 5:
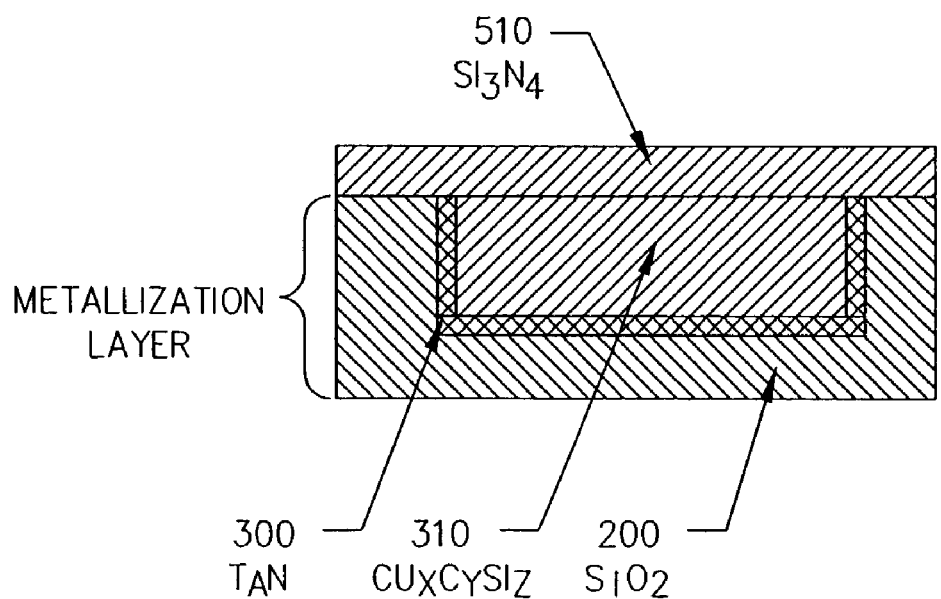
FIG. 5 depicts an embodiment of a cross-sectional view of the substrate of FIG. 4 after application of a passivation layer and diffusion of silicon into the carbon-doped copper interconnect.

Referring now to FIG. 5, there is shown an embodiment of a cross-sectional view of the substrate of FIG. 4 after application of a passivation layer and diffusion of silicon into the carbon-doped copper interconnect. After the metallization layer, a layer of interconnects and dielectric, may be planarized or polished, the surface may be cleaned with a plasma such as ammonia ($NH_3$), hydrogen (H2), argon (Ar), or other reducing agent, and exposed to silane ($SiH_4$) gas in a reaction chamber, before forming an etch stop layer such as silicon nitride ($Si_3N_4$) 510 or a silicon carbide (SiC) layer. Exposure to the $SiH_4$ may deposit Si on the interconnect through a decomposition reaction to facilitate diffusion of silicon (Si) into $Cu_XC_Y$ 310 of FIGS. 3 and 4 to form $Cu_XC_YSi_Z$ 500 without forming a corresponding copper suicide layer overlying the interconnect, $Cu_XC_YSi_Z$ 500. In the present embodiment, the diffusion of silicon (Si) into $Cu_XC_Y$ 310 may form $Cu_XC_YSi_Z$ 500, an interconnect with silicon doping in a range from 300 to 900 parts per million of silicon.

In alternative embodiments, the interconnect may be doped with silicon prior to or substantially simultaneously with doping the interconnect with carbon, such as by ion implantation and/or diffusion. In still further embodiments, the interconnect may be doped with silicon in a concentration and/or distribution such that a copper silicide layer may not form overlying the carbon-doped and silicon-doped copper interconnect.

A passivation layer such as a $Si_3N_4$ layer 510 may be formed overlying the interconnects to prevent contamination. The $Si_3N_4$ layer 510 may be formed with a vapor deposition technique such as plasma enhanced chemical vapor deposition (PECVD). PECVD may deposit the $Si_3N_4$ layer 510 within a temperature range of 200 to 425 degrees Celcius. In other embodiments, a chemical-mechanical polishing (CMP) stop layer such as $SiO_2$ may be formed after exposing the interconnect to silane.

Tests show that forming an $Cu_XC_YSi_Z$ interconnect, such as $Cu_XC_YSi_Z$ 500, may produce unexpected results, in regards to the electromigration reliability of the interconnect, yielding, in some embodiments, over twelve times the MTF as a Cu interconnect, six times the MTF as a $Cu_XC_Y$ interconnect, and three and a half times the MTF of a silicon-doped copper ($Cu_XSi$) interconnect. In addition, the tests show an increased activation energy for $Cu_XC_YSi_Z$ 500 over the Cu interconnect, $Cu_XC_Y$ interconnect, and $Cu_XSi$ interconnect.

In some embodiments, $Si_3N_4$ 510 may be formed as an etch stop. A limitation to the damascene process, for example, may be to properly endpoint for etching a dielectric because the dielectric may serve both as an intra-level insulator for the interconnects or metal lines within a layer and as an inter-level insulator between metallization layers. Thus, when the $SiO_2$ 200 may be etched, some embodiments may use an etch stop layer or film, so that the depth(s) of the etch may be substantially uniform across the substrate. The etch stop film may also have insulative properties such as silicon nitride ($Si_3N_4$) layer 510.

In some embodiments, $Si_3N_4$ layer 510 may be approximately 100 angstroms to 2000 angstroms in thickness. Oxides of silicon and $Si_3N_4$ may be formed using chemical vapor deposition (CVD) in the same or separate reaction chambers or processing chambers. A sequence for forming the layers may be to insert a substrate into a silicon nitride process chamber, deposit the silicon nitride, remove the substrate, insert the substrate into a silicon oxide chamber, and form the silicon oxide.

In other embodiments, such as embodiments wherein SiC may be used for an etch stop layer, SiC may be deposited by plasma enhanced chemical vapor deposition (PECVD) using (Tetra-, Tri-, Di-, etc.)MethylSilane, $Si(CH_3)_XH_4$—X, precursors, wherein X is in a range from 0–4, or by using $SiH_4$ and methane ($CH_4$) at temperatures ranging from 250 to 450 degrees Celsius. Although other temperatures may be used, lower temperatures may produce films of a lower density and higher temperatures may increase the risk of damaging devices in the circuit layer. Further embodiments may comprise other deposition techniques to deposit SiC.

Figure 6:
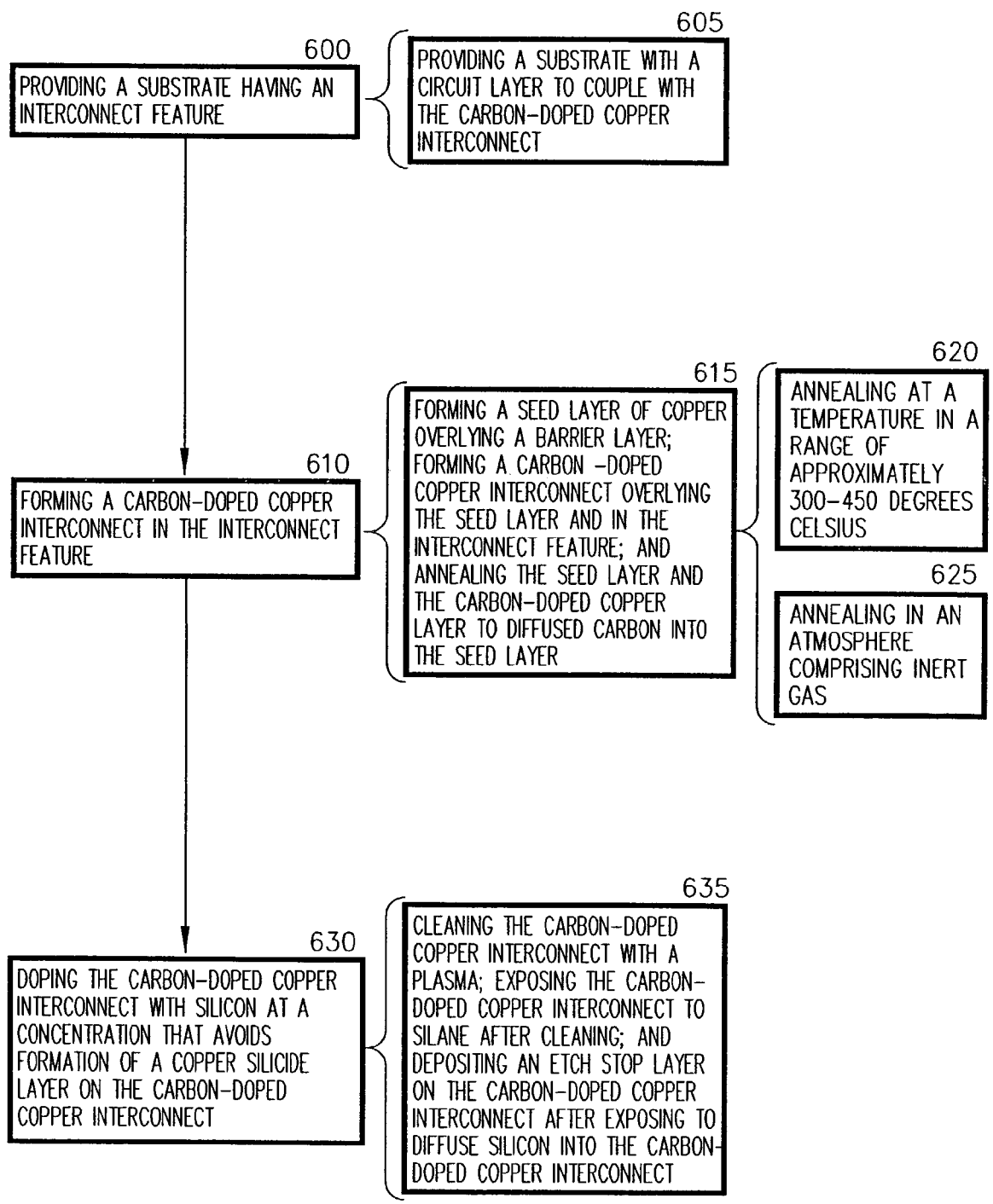
FIG. 6 depicts a flow chart of an embodiment to enhance an interconnect.

Referring now to FIG. 6, there is shown a flow chart of an embodiment to enhance an interconnect. The embodiment may comprise providing a substrate having an interconnect feature 600; forming a carbon-doped copper interconnect in the interconnect feature 610; and doping the carbon-doped copper interconnect with silicon at a concentration that avoids formation of a copper silicide layer on the carbon-doped copper interconnect 630. Providing a substrate having an interconnect feature 600 may provide a substrate such as a substrate of a wafer having an interconnect feature designed to provide a conductive path. The conductive path, or interconnect, may, in some embodiments, facilitate access to or use of a device built in and/or on the substrate. Providing a substrate having interconnect features 600 may comprise providing the substrate with a circuit layer to couple with the carbon-doped copper interconnect 605. The circuit layer may comprise one or more devices such as transistors and capacitors. An insulator layer or dielectric layer, such as $SiO_2$, may be formed on top the circuit layer with an opening(s) to define an interconnect feature(s). In addition, the opening(s) or interconnect feature(s) may be designed to facilitate formation of carbon-doped copper interconnect(s).

Forming a carbon-doped copper interconnect in the interconnect feature 610 may form an interconnect to provide a conductive path between contacts of one or more devices in the circuit layer and/or external devices. In some embodiments, forming a carbon-doped copper interconnect in the interconnect feature 610 may comprise forming a seed layer of copper overlying a barrier layer; forming a carbon-doped copper interconnect overlying the seed layer and in the interconnect feature; and annealing the seed layer and the carbon-doped copper layer to diffuse carbon into the seed layer 615. The seed layer may overlie a dielectric layer, such as $SiO_2$, with a thickness in a range of approximately 1000 to 3000 angstroms. In many embodiments, a barrier layer may overlie the dielectric layer and the seed layer may overlie the barrier layer.

In many embodiments, the seed layer may be formed by employing a directional deposition technique using metals, metal alloys, metal compounds, multiple layers of metal stack or any substrates wherein a metal may nucleate and grow. The seed layer may comprise a metal such as a metal alloy and may comprise copper, copper alloy, nickel, silver, gold, and cobalt. In several embodiments, the seed layer may be physically or chemically treated in-situ or ex-situ using a liquid or a chemically active or inert gas. For example, the seed layer surface may be exposed to a gas, such as argon, helium, oxygen, hydrogen, and nitrogen, or some combination thereof, prior to forming the conductive layer overlying the seed layer. In other embodiments, the seed layer may be exposed to liquid such as acid, base, solvent, and/or deionized water prior to electrolytic/electroless plating of the conductive layer. In still further embodiments, the seed layer may be annealed in a forming gas or vacuum to reduce or to eliminate contaminants on the substrate.

Forming a carbon-doped copper interconnect overlying the seed layer and in the interconnect feature may comprise depositing copper and/or carbon-doped copper in the interconnect feature(s) of the substrate or wafer. Copper or carbon-doped copper may be deposited in the interconnect feature by forming a layer of metal overlying the seed layer and removing the excess or by a process such as sputtering, electroplating, electroless, physical vapor deposition, chemical vapor deposition, and ion implantation. For example, the part of the seed layer overlying the interconnect feature may be exposed to a plating solution. The seed layer may be exposed to the plating solution by immersion in a plating bath, by spraying the seed layer with the plating solution, or by a similar process. A redox reaction may occur between the metal ions in the plating solution, causing the metal to plate on the seed layer. After copper may be deposited on a part of the seed layer in the interconnect feature, the copper may be doped with carbon through ion implantation or a similar process. In some embodiments, the plating solution may deposit carbon on the seed layer with the copper.

In some embodiments, after forming a carbon-doped copper interconnect, the interconnect, the seed layer and the carbon-doped copper layer, may be annealed to diffuse carbon into the seed layer. Annealing may comprise annealing at a temperature in a range of approximately 300–450 degrees Celsius 620 and/or annealing in an atmosphere comprising an inert gas 625. Annealing in an atmosphere comprising an inert gas 625 may comprise annealing in an atmosphere comprising nitrogen or hydrogen, or consisting of nitrogen or hydrogen. In alternative embodiments, depending upon factors such as the melting point of the seed layer and conductive layer, annealing may be performed near 200 degrees Celsius. In many embodiments, annealing may modify the grain structure of the carbon-doped copper interconnect and facilitate substantially uniform distribution of the carbon doping through the interconnect.

Doping the carbon-doped copper interconnect with silicon at a concentration that avoids formation of a copper silicide layer on the carbon-doped copper interconnect 630 may distribute silicon uniformly through the carbon-doped interconnect. In some embodiments, the diffusion of silicon uniformly through the carbon-doped interconnect may improve adhesion between the interconnect and an overlying layer. In alternative embodiments, doping the carbon-doped copper interconnect with silicon may comprise doping a layer near a surface of the carbon-doped interconnect with silicon to change the adhesion properties of the surface.

Doping the carbon-doped copper interconnect with silicon at a concentration that avoids formation of a copper silicide layer on the carbon-doped copper interconnect 630 may comprise cleaning the carbon-doped interconnect with a plasma; exposing the carbon-doped copper interconnect to silane after cleaning; and depositing an etch stop layer on the carbon-doped copper interconnect after exposing to diffuse silicon into the carbon-doped copper interconnect 635. Cleaning part of the carbon-doped layer with plasma may comprise cleaning the surface of the carbon-doped copper, and, in some embodiments, the surface of the metallization layer, with ammonia. In other embodiments, cleaning part of the carbon-doped layer with plasma may comprise cleaning the surface of the carbon-doped copper with $H_2$.

After cleaning the surface of the interconnect in a reducing atmosphere, exposing the interconnect to silane may diffuse silicon into the interconnect. Depositing an etch stop layer may comprise forming a passivation layer overlying the contact and/or forming a silicon nitride layer, silicon carbide layer, or the like. For example, the metallization layer comprising the interconnect may be a second metallization layer of more than two metallization layers. The first metallization layer and the remaining metallization layer(s) may comprise a carbon-doped and silicon-doped interconnect and/or other interconnects.

Figure 7:
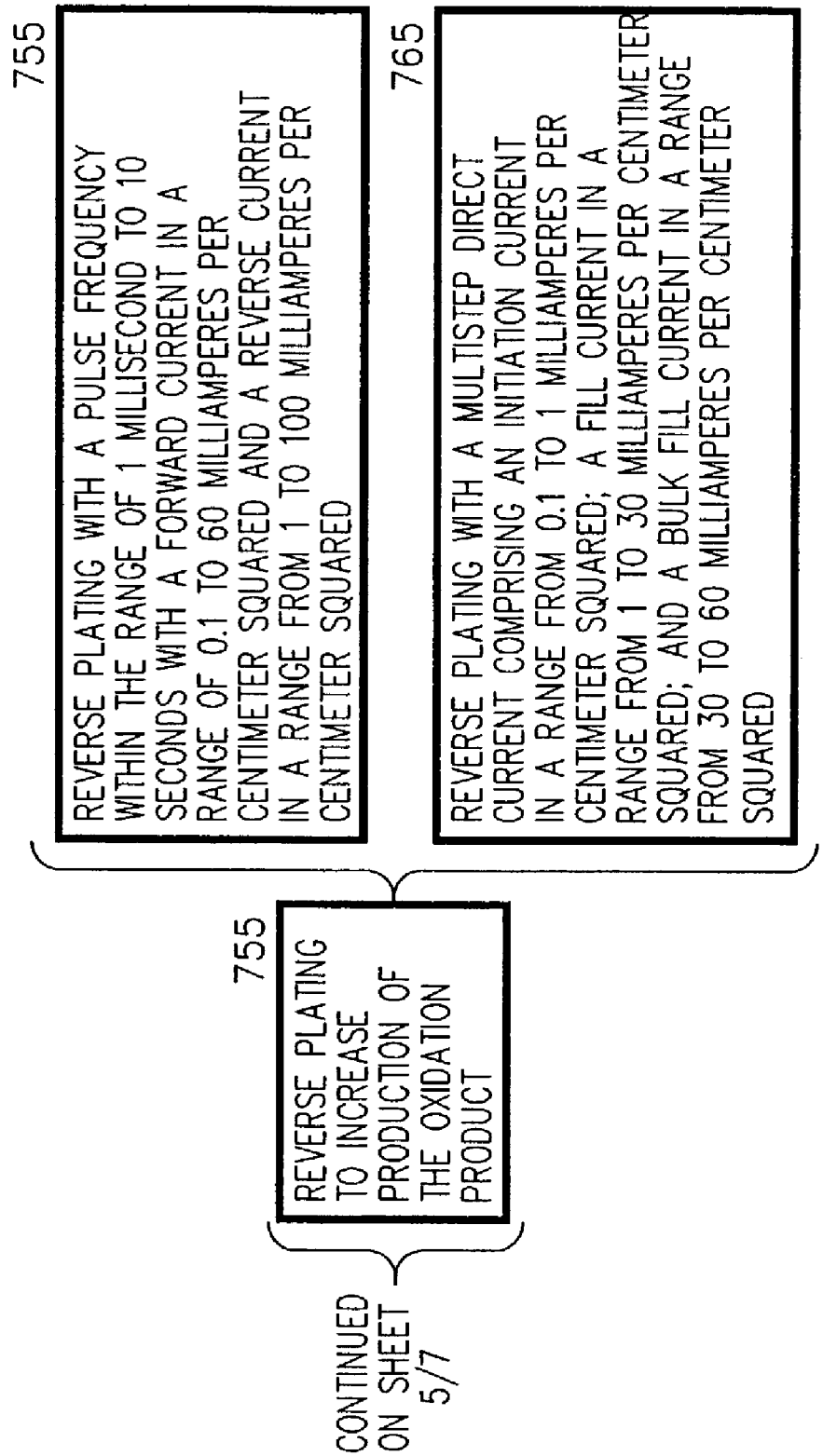
FIG. 7 depicts a flow chart of an embodiment to enhance an interconnect.

Referring now to FIG. 7, there is shown a flow chart of an embodiment to enhance electromigration reliability of an interconnect. The embodiment may comprise providing a substrate with a dielectric layer having an interconnect feature 700; forming a barrier layer overlying the dielectric layer 720; forming a carbon-doped copper layer overlying the barrier layer 740; removing part of the carbon-doped copper layer 780; and doping a remaining part of the carbon-doped copper layer with silicon at a concentration to avoid formation of a copper silicide layer on the carbon-doped copper layer 790. Providing a substrate with a dielectric layer having an interconnect feature 700 may provide a wafer of a semiconductor device having one or more devices like transistors, thyristors, resistors, capacitors, etc., built into a circuit layer. A dielectric layer may overlie the circuit layer to insulate at least part of the circuit layer from contact with an interconnect. Providing a substrate with a dielectric layer having an interconnect feature 700 may comprise removing part of the dielectric layer to form the interconnect feature 705. Removing part of the dielectric layer to form the interconnect feature 705 may remove dielectric to form openings in the shape of interconnects and expose contacts of the circuit layer to couple the contacts to the interconnects with an interconnect called a via.

In some embodiments, removing part of the dielectric layer to form the interconnect feature 705 may comprise etching and etching may comprise a wet or dry chemical reaction or physical removal such as sputter etch. For example, in one embodiment, etching may comprise photolithography or coating part of the dielectric layer with photoresist; and developing part of the photoresist to etch the interconnect feature into the dielectric layer 710. The photoresist may desolve with developer after exposure, or a lack thereof, to high intensity light. Negative photoresist, for instance, remains in areas that were not protected from exposure to light and positive photoresist remains in areas protected from exposure to light.

After a substrate comprises an interconnect feature, an interconnect may be formed by depositing metal or other conductive material into the interconnect feature. The remaining dielectric of the dielectric layer with the interconnect feature may insulate one interconnect from another and insulate an interconnect from a device in the circuit layer.

The present embodiment may comprise forming a barrier layer overlying the dielectric layer 720 to prevent or attenuate degradation of the remaining dielectric and/or the circuit layer as a result of diffusion of the interconnect material into the remaining dielectric and/or the circuit layer. In some embodiments, forming a barrier layer overlying the dielectric layer 720 may promote adhesion between the interconnect and surrounding materials. Forming a barrier layer overlying the dielectric layer 720 may comprise forming a layer coupled with the dielectric layer and the interconnect feature, having substantially uniform thickness 725 and forming a layer of tantalum nitride 730. Forming a layer coupled with the dielectric layer and the interconnect feature, having substantially uniform thickness 725 may comprise forming a layer overlying the dielectric layer in an interconnect feature and, in several embodiments, over part of the dielectric layer outside an interconnect feature. The barrier layer may be formed of tantalum, tantalum nitride, titanium nitride, titanium silicon nitride, tungsten nitride, tungsten-tantalum, tantalum silicon nitride or other ternary compounds. The uniform thickness of the barrier layer may be accomplished using deposition techniques such as CVD, PVD, ALD, electrolytic plating or electroless plating. Uniform thickness of the barrier layer may promote uniform current distribution or flow through the barrier layer and the corresponding interconnect, whereas non-uniform interconnects may adversely affect the reliability of the integrated circuit by comprising a higher current density in an area, resulting in lower electromigration resistance for the area.

Referring still to FIG. 7, the embodiment may comprise forming a carbon-doped copper layer overlying the barrier layer 740. Forming a carbon-doped copper layer overlying the barrier layer 740 may comprise electroplating with copper using a plating solution comprising electrolyte and an organic additive, wherein carbon is doped from the plating solution 745 and doping with carbon through an oxidation product of the organic additive 750. The copper may be doped with carbon from the plating solution based upon the plating chemistry and plating waveform. The plating chemistry may be dependent upon the plating bath or plating solution(s) used to plate the substrate. In the present embodiment a plating bath may comprise approximately 15–60 grams per liter of copper, 5–250 grams per liter of sulfuric acid ($H_2SO_4$), 20–200 milligrams per liter of chlorine (Cl), 1–100 parts per million of anti-suppressor such as di-sulfide, and 10–500 parts per million of suppressor such as polyethers and polyamides. In other embodiments, the electrolyte may comprise copper, sulfuric acid and chlorine 770, and the organic additives may comprise suppressors and anti-suppressors 775. The suppressors may comprise bath soluble polyethers, polyamines, and polyamids and the anti-suppressors may comprise bath souluble disulfide or mono-sulfide.

The plating waveform may be dependent upon the electrical fields applied while electroplating. In the present embodiment, the plating waveform may comprise reverse plating to increase production of the oxidation product 755. Reverse plating, in many embodiments, may enhance the oxidation product of the organic additives to dope the copper with carbon. Reverse plating may comprise reverse plating with a pulse frequency within the range of 1 millisecond to 10 seconds with a forward current in a range of 0.1 to 60 milliamperes per square centimeter and a reverse current in a range from 1 to 100 milliamperes per square centimeter 760. Reverse plating with a copper anode instead of phosphorized copper anode may also enhance the oxidation of organic additives.

In other embodiments, reverse plating may comprise reverse plating with a multi-step direct current comprising an initiation current in a range from 0.1 to 1 milliamperes per square centimeter; a fill current in a range from 1 to 30 milliamperes per square centimeter; and a bulk fill current in a range from 30 to 60 milliamperes per square centimeter 765. The fill current may be applied one or more times. The speed of the reaction may be adjusted based upon the frequency and magnitude of the currents applied so other frequencies and current magnitudes may be practiced in some embodiments.

Removing part of the carbon-doped copper layer 780 may remove carbon-doped copper outside the interconnect feature to substantially define the carbon-doped copper interconnect. Removing part of the carbon-doped copper layer 780 may be accomplished by several methods such as chemical-mechanical polishing (CMP) and/or an etching process. In the present embodiment, removing part of the carbon-doped copper layer 780 may comprise polishing off part of the carbon-doped copper layer and part of the barrier layer 785. For example, CMP may polish away or remove the excess copper or carbon-doped copper and the barrier layer above the dielectric layer, so that copper or carbon-doped copper and the barrier layer remain in the interconnect feature. Also, the resulting metallization layer may be substantially uniform thickness after CMP.

Doping a remaining part of the carbon-doped copper layer with silicon at a concentration to avoid formation of a copper silicide layer on the carbon-doped copper layer 790 may comprise doping the carbon-doped copper interconnect as defined after polishing with silicon by ion implantation and/or diffusion. For example, silicon may be diffused into the copper by placing the remaining part of the carbon-doped copper layer into a reaction chamber; generating plasma in the reaction chamber; and releasing silane into the reaction chamber to diffuse silicon into the remaining part of the carbon-doped copper layer 795.

Figure 8:
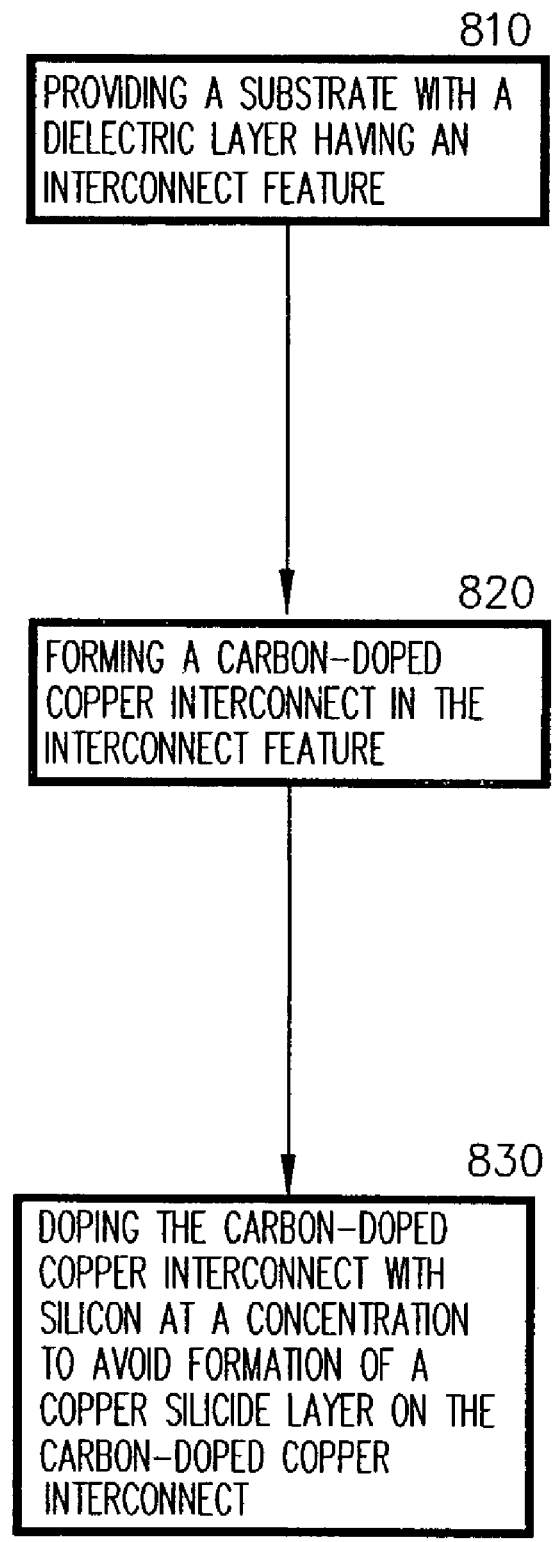
FIG. 8 depicts a flow chart of an embodiment to enhance an interconnect.

Referring now to FIG. 8, there is shown a flow chart of an embodiment comprising providing a substrate with a dielectric layer having an interconnect feature 810; forming a carbon-doped copper interconnect in the interconnect feature 820; and doping the carbon-doped copper interconnect with silicon at a concentration to avoid formation of a copper silicide layer on the carbon-doped copper interconnect 830. Providing a substrate with a dielectric layer having an interconnect feature 810 may comprise providing a wafer having openings in a dielectric layer overlying a circuit layer. The openings may define an intended pattern of interconnects for a metallization layer. In many embodiments, providing a substrate with a dielectric layer having an interconnect feature 810 may comprise removing part of the dielectric layer to form an interconnect by a process such a photolithography.

Forming a carbon-doped copper interconnect in the interconnect feature 820 may comprise electroplating with copper using a plating solution comprising electrolyte and an organic additive, wherein carbon is doped from the plating solution. In alternative embodiments, the copper may be deposited in the interconnect feature and the copper may be doped with carbon through ion implantation. In some embodiments, forming a carbon-doped copper interconnect in the interconnect feature 820 may comprise forming the carbon-doped interconnect after forming a barrier layer such as a barrier layer of tantalum nitride to reduce or prevent diffusion of ions of carbon or copper into the dielectric layer and/or the circuit layer.

Doping the carbon-doped copper interconnect with silicon at a concentration to avoid formation of a copper silicide layer on the carbon-doped copper interconnect 830 may comprise instructions for doping the carbon-doped copper with silicon before and/or after the interconnect is defined by polishing and/or etching. Doping the carbon-doped copper interconnect with silicon at a concentration to avoid formation of a copper silicide layer on the carbon-doped copper interconnect 830 may further comprise doping the copper and/or distributing the silicon doping in the copper such that a copper silicide layer may not form overlying the carbon-doped and silicon-doped copper interconnect.

Other embodiments may comprise doping the interconnect with silicon prior to or substantially simultaneously with doping the interconnect with carbon, such as by ion implantation and/or diffusion.

What is claimed is:

1. An integrated circuit, comprising:
 a substrate having an interconnect feature;
 an interconnect having a pair of walls and a bottom, the interconnect formed in direct contact with a barrier layer such that the barrier layer is in direct contact with the pair of walls and the bottom of the interconnect, wherein the interconnect is coupled with the interconnect feature of said substrate, the interconnect consisting essentially of copper, silicon, and carbon; and a passivation layer coupled with and adjacent to said interconnect.

2. The integrated circuit of claim 1, further comprising packaging coupled with said substrate and said passivation layer to protect said apparatus from damage.

3. The integrated circuit of claim 1, wherein said interconnect comprises a substantially uniform distribution of carbon.

4. The integrated circuit of claim 1, wherein said interconnect comprises a carbon doping in a range from approximately 4 parts per million to 100 parts per million.

5. The integrated circuit of claim 1, wherein said interconnect comprises a substantially uniform distribution of silicon.

6. The integrated circuit of claim 1, wherein said interconnect comprises a silicon doping in a range from approximately 300 parts per million to 900 parts per million.

7. The integrated circuit of claim 1, further comprising an interlayer dielectric layer formed directly on the interconnect.

8. The integrated circuit of claim 1, wherein the interconnect has a concentration of silicon sufficient to avoid formation of a copper silicide layer.

* * * * *

UNITED STATES PATENT AND TRADEMARK OFFICE
CERTIFICATE OF CORRECTION

PATENT NO. : 7,135,775 B2 Page 1 of 1
APPLICATION NO. : 10/292326
DATED : November 14, 2006
INVENTOR(S) : Chambers et al.

It is certified that error appears in the above-identified patent and that said Letters Patent is hereby corrected as shown below:

Column 7, at line 10, delete "suicide" and insert --silicide--.

Signed and Sealed this

Fourth Day of December, 2007

JON W. DUDAS
*Director of the United States Patent and Trademark Office*